(12) United States Patent
Webb

(10) Patent No.: US 11,088,097 B2
(45) Date of Patent: Aug. 10, 2021

(54) EFFECTIVE MEDIUM SEMICONDUCTOR CAVITIES FOR RF APPLICATIONS

(71) Applicant: International Business Machines Corporation, Armonk, NY (US)

(72) Inventor: Bucknell C. Webb, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/414,042

(22) Filed: May 16, 2019

(65) Prior Publication Data
US 2019/0273053 A1    Sep. 5, 2019

Related U.S. Application Data

(62) Division of application No. 14/985,839, filed on Dec. 31, 2015, now Pat. No. 10,410,981.

(51) Int. Cl.
| | |
|---|---|
| *H01L 23/66* | (2006.01) |
| *H01Q 1/22* | (2006.01) |
| *H01Q 1/38* | (2006.01) |
| *H01Q 1/40* | (2006.01) |
| *H01Q 9/06* | (2006.01) |

(52) U.S. Cl.
CPC ........... *H01L 23/66* (2013.01); *H01Q 1/2283* (2013.01); *H01Q 1/38* (2013.01); *H01Q 1/405* (2013.01); *H01Q 9/065* (2013.01); *H01L 2223/6627* (2013.01); *H01L 2223/6677* (2013.01)

(58) Field of Classification Search
CPC ............................. H01L 23/66; H01L 29/0649
See application file for complete search history.

(56) References Cited

U.S. PATENT DOCUMENTS

| | | | |
|---|---|---|---|
| 6,685,844 B2 | 2/2004 | Rich et al. | |
| 6,806,805 B2 | 10/2004 | Ahn et al. | |
| 7,006,044 B2 | 2/2006 | Choi et al. | |
| 7,030,721 B2 | 4/2006 | Yoshida et al. | |
| 7,851,923 B2 | 12/2010 | Erturk et al. | |
| 2005/0059217 A1 | 3/2005 | Morrow et al. | |
| 2005/0104148 A1 | 5/2005 | Yamamoto et al. | |
| 2006/0228831 A1 | 10/2006 | Nasiri et al. | |
| 2006/0276157 A1 | 12/2006 | Chen et al. | |
| 2007/0164907 A1 | 7/2007 | Gaucher et al. | |
| 2009/0140365 A1* | 6/2009 | Lee | H01L 27/1464 257/460 |
| 2010/0053922 A1 | 3/2010 | Ebefors et al. | |
| 2012/0013022 A1* | 1/2012 | Sabuncuoglu Tezcan | H01L 23/481 257/774 |
| 2013/0277789 A1* | 10/2013 | Chen | H01L 27/14687 257/460 |

(Continued)

OTHER PUBLICATIONS

List of IBM Patents or Patent Applications Treated As Related dated May 13, 2019, 2 pages.

*Primary Examiner* — Jamie C Niesz
(74) *Attorney, Agent, or Firm* — Scully, Scott, Murphy & Presser, P.C.; Daniel P. Morris, Esq.

(57) ABSTRACT

An electronic package apparatus is formed from a semiconductor substrate having a cavity formed therein. The cavity has a top surface, a bottom surface and a sidewall surface, and a spacer extending from the bottom surface to the top surface. The spacer is formed from a dielectric material and has at least one lateral dimension less than 0.1 cm.

17 Claims, 6 Drawing Sheets

(56) References Cited

U.S. PATENT DOCUMENTS

2014/0027927 A1* 1/2014 Reinmuth ............. H01L 23/481
                                                     257/774
2015/0294946 A1* 10/2015 Pagani ................... H01L 24/73
                                                     257/421
2017/0194270 A1    7/2017 Webb

* cited by examiner

EFFECTIVE MEDIUM SEMICONDUCTOR CAVITIES FOR RF APPLICATIONS

The present application relates generally to radio frequency (RF) devices, and more specifically to the integration of RF devices into semiconductor substrates.

Wireless communications use an antenna to transmit and receive electromagnetic (EM) signals. The antenna is typically driven by an integrated circuit (IC) or other discrete device. This IC or driver chip may be configured within a package on a printed circuit (PC) board, for example, along with other circuitry. The EM signal from the driver chip reaches the antenna via internal wiring or other metallization.

There is an increasing demand for compact radio communications systems having integrated transmitter, receiver, transceiver and antenna systems, which enable high data transmission rates, high volume, low power consumption, low weight, and low cost. As operating frequencies increase, the manufacture and assembly of such systems becomes increasingly difficult due to the requirements of high-precision machining and accurate alignment.

Radio frequency devices, including devices operating at 10 GHz and greater, are beneficially integrated directly onto a semiconductor substrate such as a silicon substrate. However, in view of the relatively large dielectric constant of silicon (k~11.9), locating an antenna for such devices proximate to such a high dielectric constant material can adversely affect performance. Improved performance can be achieved by locating antennae proximate to an air gap (or cavity).

A cavity requires opposing top and bottom surfaces to enclose a space, and in most device architectures these surfaces need to be mechanically supported. In conventional structures, a cavity is initially formed in one substrate and then a second (top) substrate is attached to the first substrate to enclose the cavity. It is difficult and costly, however, to ensure proper alignment of the second substrate.

Thus, it would be advantageous to provide a method and structure for providing cavities in a semiconductor substrate that are configured to house RF elements such as driver chips and antennae and that obviate the need for aligning and securing a second substrate to enclose the cavity.

SUMMARY

In accordance with embodiments of the present application, an electronic package apparatus includes a semiconductor substrate having a cavity formed therein. The cavity has a top surface, a bottom surface and a sidewall surface, and a spacer extending from the bottom surface to the top surface. The spacer is formed from a dielectric material and has at least one lateral dimension less than 0.1 cm.

A method of making an electronic package apparatus includes etching trenches in a front surface of a semiconductor substrate, where the trenches have a lateral dimension of less than 0.1 cm, and at least partially filling the trenches with a first dielectric material. The method further involves depositing a layer of a second dielectric material over the front surface of the substrate, and etching a back surface of the semiconductor substrate to expose the first dielectric material. A layer of a third dielectric material is deposited over the back surface of the substrate, and a cavity having a top surface, a bottom surface, and a sidewall surface is etched in the semiconductor substrate such that the first dielectric material forms at least one spacer extending between the bottom surface to the top surface.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1A:
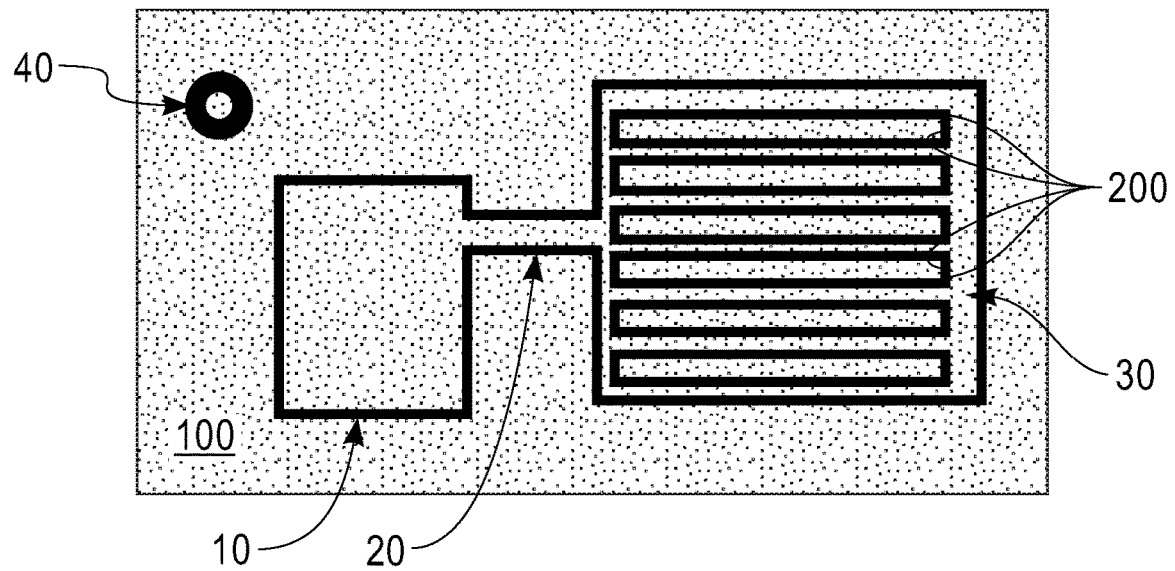
FIG. 1A is a top-down plan view showing a trench architecture for the formation of a chip cavity, a stripline cavity, and an antenna cavity within a semiconductor substrate.

Reference will now be made in greater detail to various embodiments of the subject matter of the present application, some embodiments of which are illustrated in the accompanying drawings. The same reference numerals will be used throughout the drawings to refer to the same or similar parts.

Embodiments relate to apparatus and methods for packaging integrated circuit chips with integrated antennae to form high-performance radio/wireless communication systems for millimeter wave applications, e.g., for voice and data communications. Antennae such as planar antennae are incorporated into a semiconductor substrate proximate to a cavity structure and connected to an on-board IC chip.

Various chip types may be packaged with one or more antenna. Example IC chips include integrated transmitter circuits, integrated receiver circuits, integrated transceiver circuits, and/or other support circuitry, which can be incorporated into various types of devices for wireless communication applications.

A cavity structure for an RF device is formed in a semiconductor substrate such as a silicon substrate where opposing top and bottom surfaces of one or more cavities formed in the substrate are supported by a network of pillars or ridges that span the cavity between the opposing surfaces. In embodiments, the length and/or width of the pillars or ridges is less than 0.1λ, where λ is the operational wavelength of the device. For instance, an extremely high frequency device may operate at a frequency of 30 to 300 GHz (1 cm to 1 mm), and the length and/or width of the pillars or ridges in such devices may be less than 0.1 cm and less than 0.1 mm, respectively.

As used herein, a pillar is a columnar structure having a (vertical) height that is greater than both its length and its width. A ridge is a narrow, raised structure having a (vertical) height that is greater than at least one of its length and its width. Pillars and ridges may be collectively referred to as spacers. According to various embodiments, at least one of the length dimension or the width dimension of an example spacer may be 2, 5, 10, 20, 50, 100 or 200 microns, including ranges between any of the foregoing values.

By providing a network of spacers having one or both cross-sectional dimensions substantially less than an operational wavelength of the device, the effective dielectric constant of a cavity may be represented as a volume average of the dielectric constant of the gas (or vacuum) that fills the cavity and the material(s) used to form the spacers.

In embodiments the top and bottom surfaces of the cavity derive from a single semiconductor substrate, such as a silicon wafer, and are supported (spanned) by a network of thin silicon oxide pillars or ridges. For instance, the top and bottom surfaces of the cavity may comprise silicon wafer-process compatible layers, including one or more deposited layers such as dielectric layers, or incumbent substrate material such as silicon (Si). A cavity height may range from 50 to 750 microns. The cavity height of different cavities (e.g., chip cavity and antenna cavity) may be the same or different. Expressed as a percentage of the total thickness of the semiconductor substrate, a cavity height may be 5, 10, 20, 50, 75, 90, 95 or 100% of the substrate thickness, including ranges between any of the foregoing values.

The spacers may be aligned perpendicular to the direction of the electric field that passes through the cavity during use of the device such that the effective dielectric constant of the cavity is near that of free space. A cavity may be closed or substantially closed.

Schematic views illustrating an example method of forming cavity structures in a semiconductor substrate are shown in FIGS. 1-6, where FIGS. 1A-6A are top-down plan views and FIGS. 1B-6B are corresponding cross-sectional views.

Shown in FIG. 1A is a semiconductor substrate 100 such as a silicon substrate having formed therein plural trenches 200 that define, in the illustrated embodiment, a chip cavity area 10, a stripline cavity area 20, an antenna cavity area 30, and a through substrate via (TSV) 40. Trenches 200 also define the location of a plurality of spacers, e.g., within antenna cavity area 30. The illustrated embodiment includes multiple ring-shaped trenches within the antenna cavity area 30.

Substrate 100 may be a semiconductor material such as silicon or a silicon-containing material, including a bulk substrate. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid in which the crystal lattice of the entire sample is substantially continuous and substantially unbroken to the edges of the sample with substantially no grain boundaries.

In embodiments, substrate 100 may be a semiconductor-on-insulator (SOI) substrate. Further, substrate 100 is not limited to silicon-containing materials, as the substrate 100 may comprise other semiconductor materials, including Ge and compound semiconductors such as GaAs, InAs, and other like semiconductors.

Figure 1B:
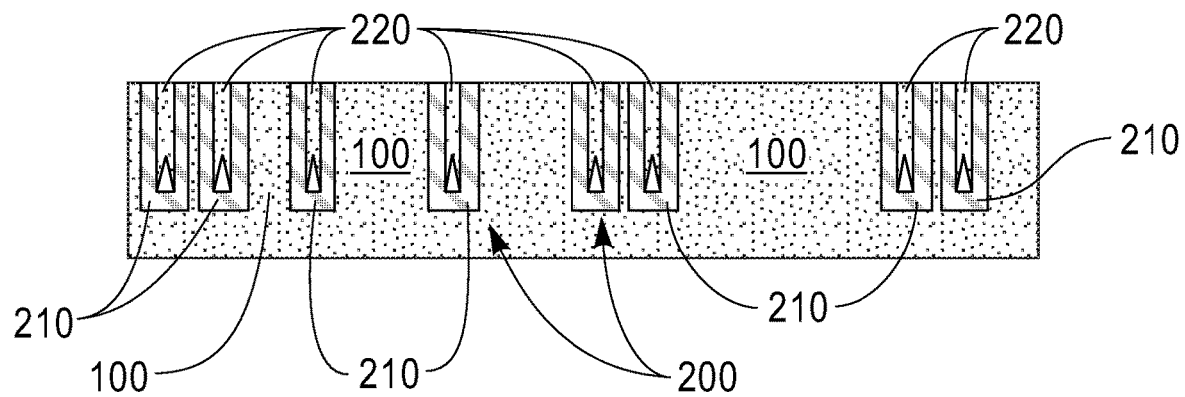
FIG. 1B is a cross-sectional view of FIG. 1A showing the formation of trenches in the semiconductor substrate and the subsequent deposition of a dielectric material and a semiconductor material within the trenches.

Referring to FIG. 1B, trenches 200 are formed in substrate 100 using conventional photolithography and etching methods. Photolithography includes forming a layer of photoresist material (not shown) atop a material or material stack to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. In the instant embodiment, this provides a patterned layer of photoresist atop a portion of the substrate 100. The pattern provided by the patterned photoresist material is thereafter transferred into the underlying material layer or material layers utilizing at least one pattern transfer etching process.

The pattern transfer etching process may be an isotropic etch or an anisotropic etch. In embodiments, a dry etching process such as, for example, reactive ion etching can be used. In other embodiments, a wet chemical etchant can be used. In still further embodiments, a combination of dry etching and wet etching can be used. For example, trenches 200 may be formed using a deep reactive-ion etching (DRIE) process and, when initially formed, extend only part way through the substrate.

Still with reference to FIG. 1B, a dielectric layer 210 such as a layer of thermal oxide is formed over exposed sidewalk of the trenches 200. The trenches are then capped with a wet etch stop material 220 such as polysilicon, silicon nitride, SiCN or SiCOH. A thermal oxide layer may be formed on exposed surfaces of the trenches 200 by oxidizing the silicon substrate at 1000-1200° C. in an oxidizing environment. The thickness of dielectric layer 210 may range from 5 microns up to 50% of the width of a trench 200.

FIG. 1B shows an intermediate architecture after deposition and planarization of the dielectric layer 210 and etch stop material 220, "Planarization" is a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Figure 2A:
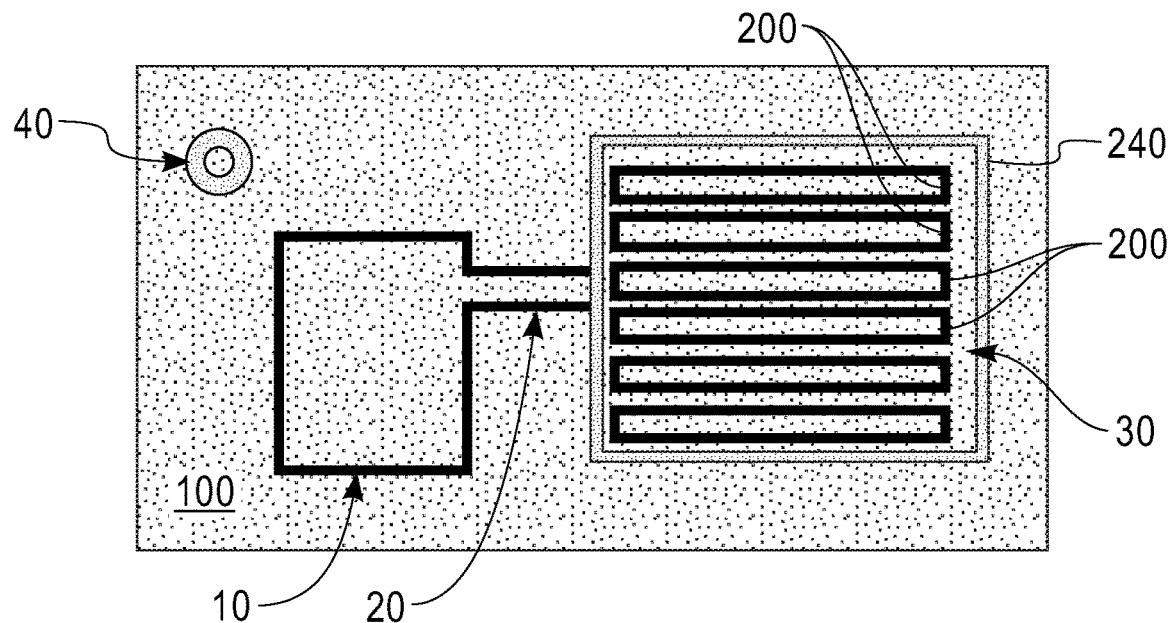
FIG. 2A shows the formation of metal layers within a through substrate via (TSV) and a trench located peripheral to the antenna cavity of FIG. 1A.
Figure 2B:
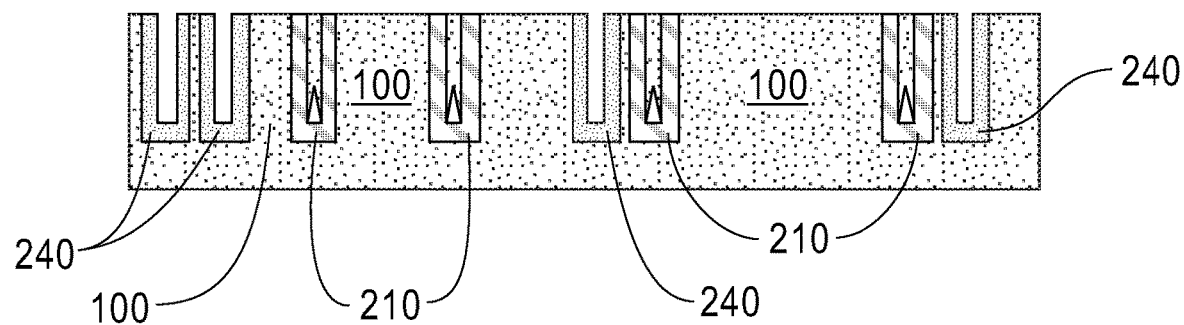
FIG. 2B shows the reopening of select vias and trenches and the conformal deposition of metal layers therein.

As shown in FIGS. 2A and 29, if through vias or metal cavity walls are desired, one or more trenches 200 may be re-opened and plated or otherwise at least partially filled with a one or more conductive materials such as copper or tungsten. Reopening of the trenches may be performed using dry etching process, e.g., reactive ion etching, a wet chemical etch, or a combination of dry etching and wet etching. A barrier layer, e.g., tantalum/tantalum nitride or titanium/titanium nitride may be initially deposited within re-opened trenches 200, followed by deposition of a metal layer by chemical vapor deposition optionally followed by electroplating. The thickness of metallization 240 may range from 0.05 microns up to 50% of the width of a trench 200. Then, a further CMP step may be used to planarize a top surface of the substrate 100, having formed therein trenches comprising a dielectric layer 210 and trenches comprising one or more layers of metallization 240. During a CMP step, etch stop material 220 may be used as a stopping layer. Following CMP, deposited metal remaining outside the trenches can be removed using reactive ion etching or RIE or wet etching.

Figure 3A:
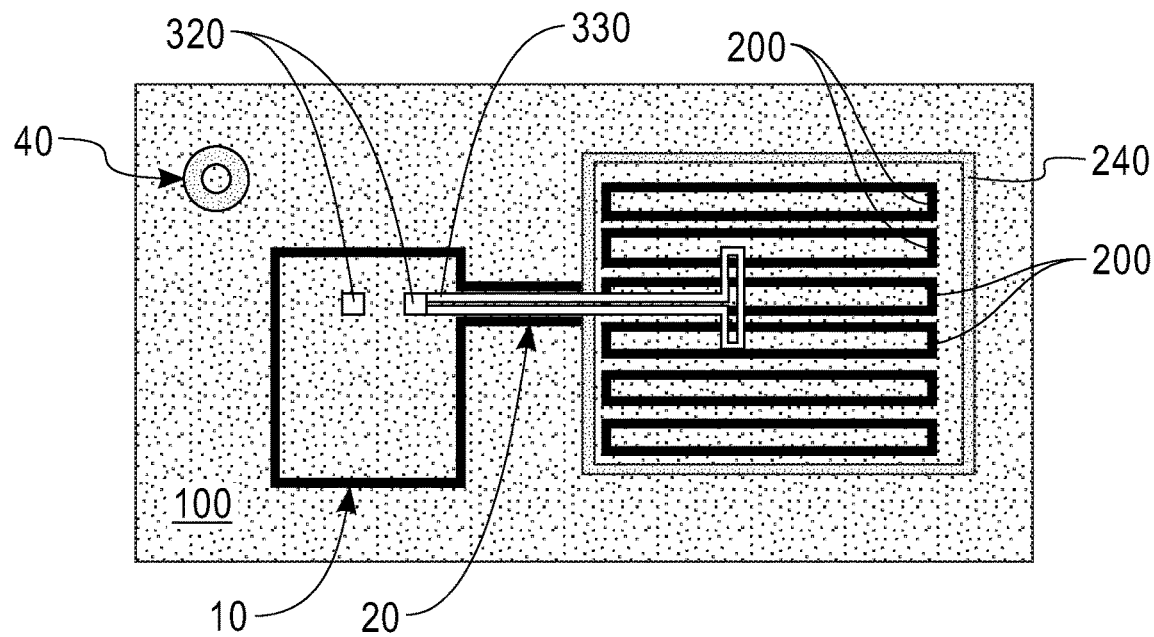
FIG. 3A depicts the formation of conductive vias and a conductive stripline extending between the chip cavity and the antenna cavity.
Figure 3B:
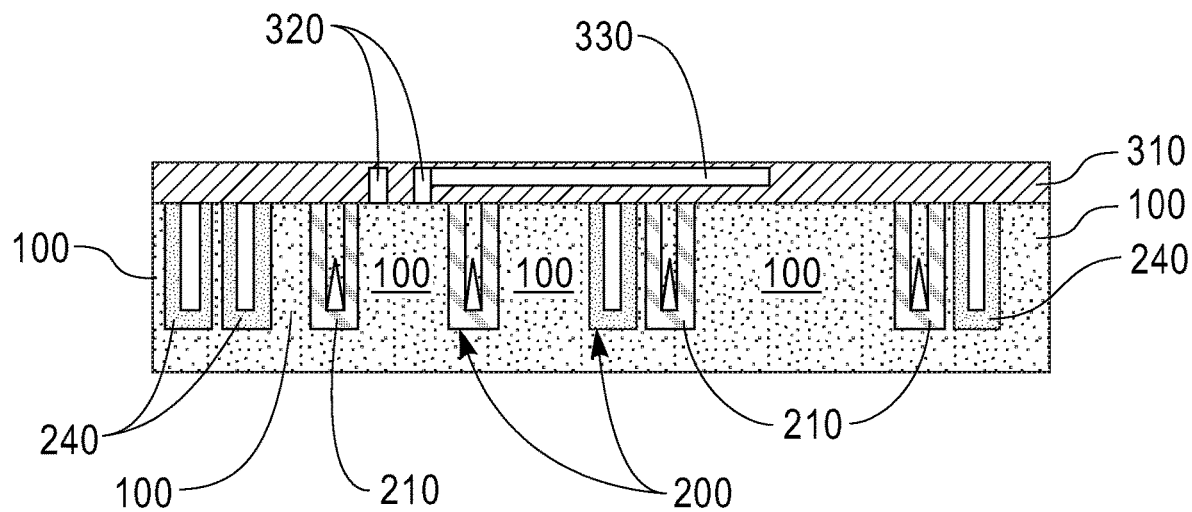
FIG. 3B shows formation of the conductive stripline within a dielectric layer formed over a front surface of the semiconductor substrate.

After planarization, as depicted in FIGS. 3A and 3B, a dielectric layer 310 may be formed over a top surface of the substrate 100 covering (at least partially) filled trenches 200. Contact vias 320, strip metallization 330, or other wiring may be formed within or on dielectric layer 310. For example, using a dry and/or wet etch, dielectric layer 310 may be locally recessed to create openings into which, as shown in FIG. 3B, a conductive material is deposited, planarized, recessed and patterned to form embedded metal structures. A plan view of the architecture of FIG. 3B is depicted in FIG. 3A, which shows the strip metallization 330 extending from the chip cavity area 10 to the antenna cavity area 30. Illustrated contact vias 320 are formed in chip cavity area 10.

Dielectric layer 310 may comprise a dielectric material such as a low-k dielectric material. Exemplary dielectric materials include silicon oxide, silicon nitride, and silicon oxynitride. Exemplary low-k dielectric materials include, but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™, Texas Instrument's Coral™ and TSMC's Black Diamond™ and Coral™. As used herein, a low-k dielectric material has a dielectric constant less than that of silicon oxide.

The dielectric layer 310 may be formed, for example, by chemical vapor deposition (CVD), atomic layer deposition (ALD) or spin-coating. In embodiments, the dielectric material may be self-planarizing, or the top surface of the dielectric layer 310 can be planarized by chemical mechanical polishing (CMP). The thickness of the dielectric layer 310 layer may range from 0.05 to 3 microns.

Contact vias 320 and strip metallization 330 may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, NiSi, CoSi, as well as combinations thereof.

Metal layers including contact vias 320, strip metallization 330, and dipole antenna 332 may be formed utilizing a conventional deposition process such as, for example, atomic layer deposition (ALD), chemical vapor deposition (CVD), metalorganic chemical vapor deposition (MOCVD), molecular beam epitaxy (MBE), sputtering and plating. A tungsten metal layer, for instance, may be deposited by chemical vapor deposition using tungsten hexafluoride as a gaseous reactant.

Figure 4A:
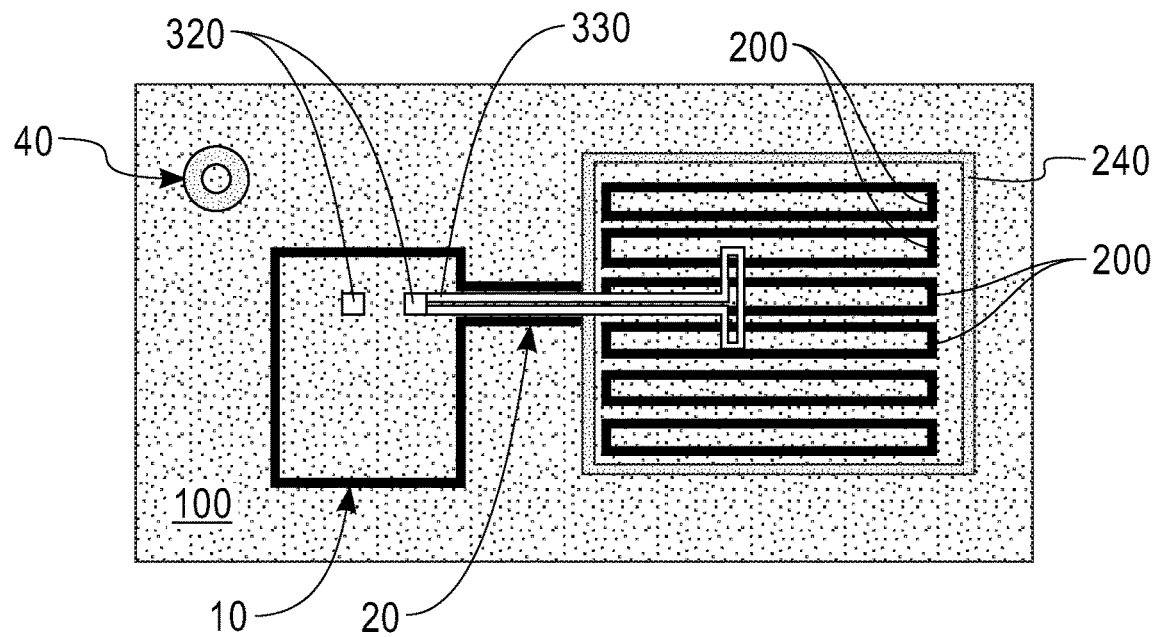
FIG. 4A is a plan view showing the intermediate architecture of FIG. 3A.
Figure 4B:
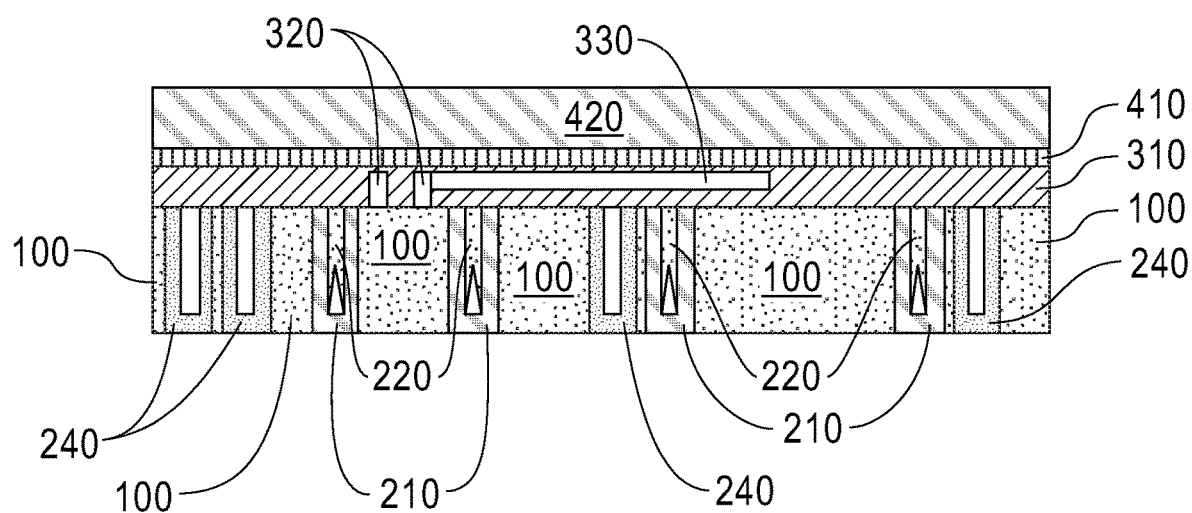
FIG. 4B depicts the lamination of a transparent layer to the dielectric layer of FIG. 3B, and thinning of the back surface of the semiconductor substrate to expose the filled vias and trenches.

Then, as shown in FIGS. 4A and 4B, a transparent layer 420 is bonded to the top surface of the dielectric layer 310. The transparent layer 420 may be thermally bonded using a binding layer 410, such as a polyimide layer, which is deposited on the top surface of the dielectric layer 310. For instance, binding layer 410 may be applied to the dielectric layer surface using a spin-coating technique. In embodiments, transparent layer 420 is permanently bonded. In alternate embodiments, transparent layer 420 is temporarily bonded. Removal processes may use solvents, laser ablation, or heat to soften the binding layer 410. As will be appreciated by those skilled in the art, the composition and thickness of the transparent layer 420 may be selected to provide desired antenna properties, including transmittance of electromagnetic radiation there through. Transparent layer 420 may comprise a light weight, low RF-loss, RF transparent glass or a ceramic. Advantageously, the transparent layer need not be aligned with a high degree of precision.

In a step that may precede or follow lamination of the transparent layer, the substrate is backside etched or otherwise thinned to expose dielectric 210 and metallization 240. In embodiments, a dry etching process such as reactive ion etching can be used. For example, plasma etching of silicon may be performed using a fluorine-containing (e.g., $CF_4$) plasma. In other embodiments, a wet chemical etchant can be used. In still further embodiments, a combination of dry etching and wet etching can be used. In still further embodiments, a combination of mechanical grinding followed by reaction ion etching can be used.

Figure 5A:
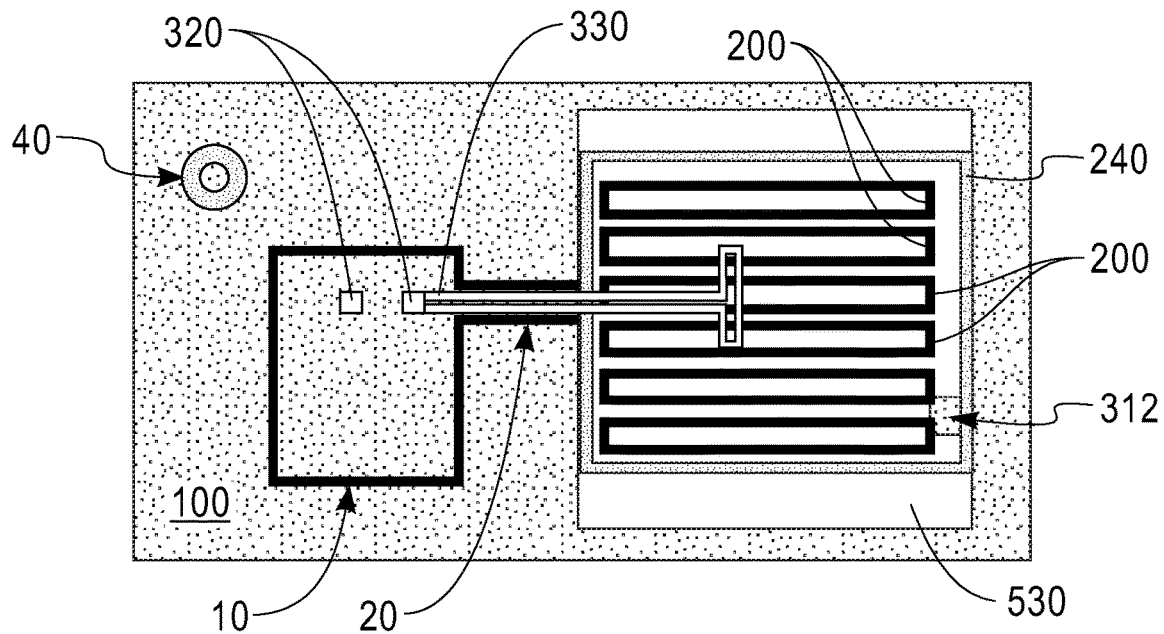
FIG. 5A shows deposition of a back metal and the formation of an optional etch port.
Figure 5B:
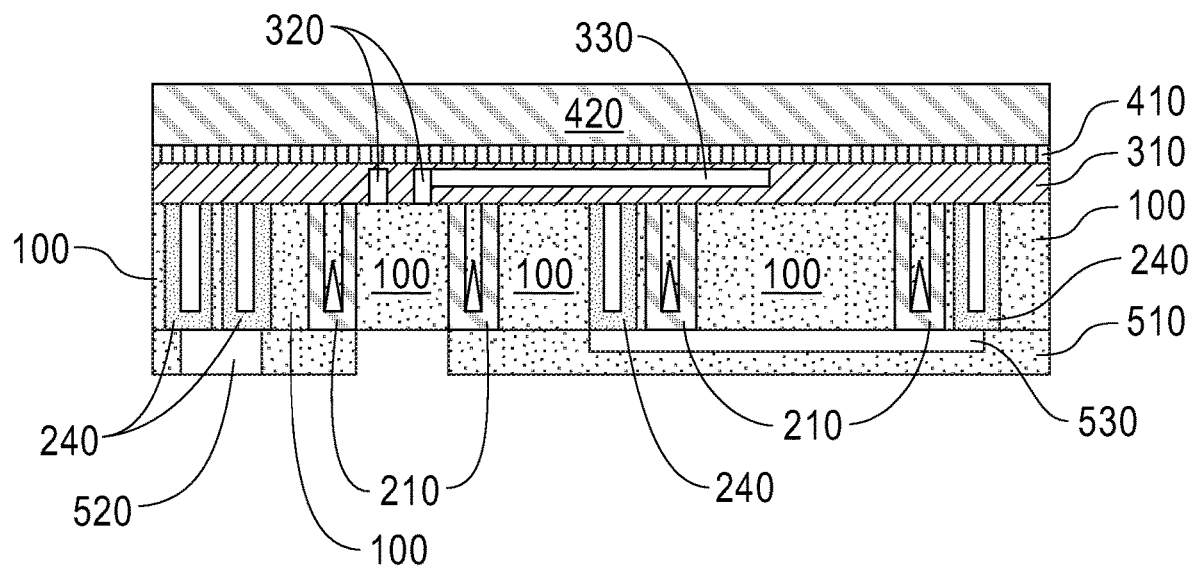
FIG. 5B shows the formation of plural wiring layers including a back metal layer embedded within a dielectric layer formed over the back surface of the semiconductor substrate.

After completion of the backside etch, as illustrated in FIGS. 5A and 5B, a dielectric layer is formed over the bottom surface of the substrate. In some embodiments, the foregoing plasma processing continues to form dielectric layer 510. By way of example, when the substrate etch is complete, the fluorine-containing gas (e.g., $CF_4$) is turned off and oxygen (or water vapor), or nitrogen, or mixtures thereof, are supplied with the plasma to form dielectric layer 510. The oxygen and/or nitrogen react with silicon to form silicon oxide, silicon nitride, and/or silicon oxynitride. Dielectric layer 510 provides mechanical support to the substrate and electrical isolation for one or more backside conductive layers. The thickness of the dielectric layer 510 layer may range from 0.05 to 1 microns. As is known to those skilled in the art, one or more conductive layers may be deposited to form contact pads 520 and reflector or patch antenna 530 on the backside of the substrate.

Figure 6A:
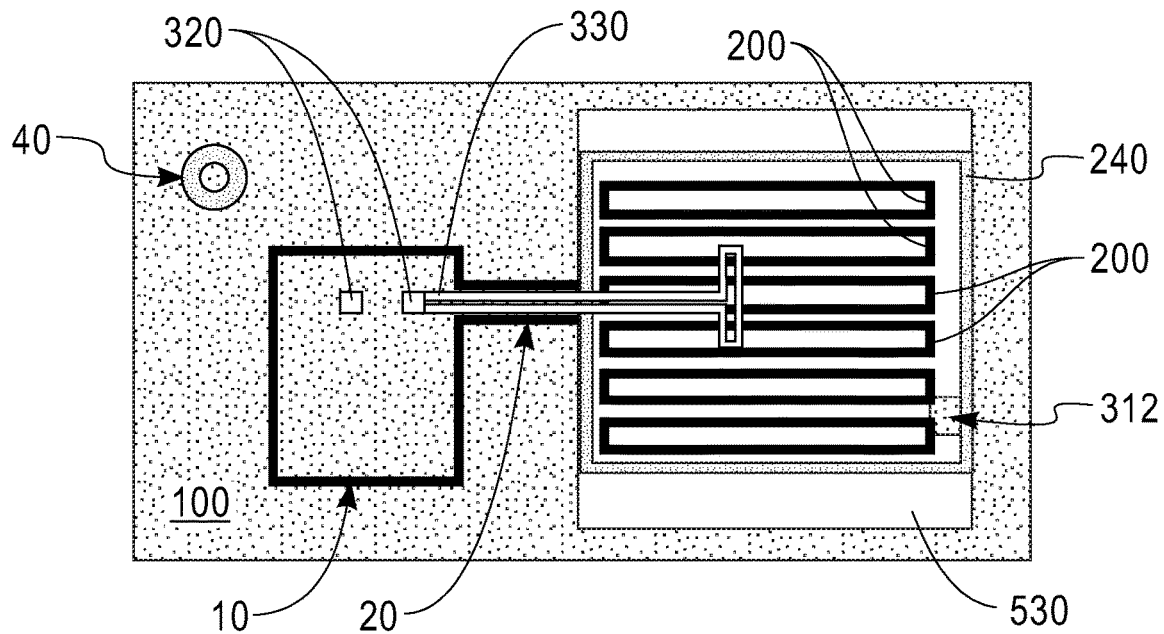
FIG. 6A shows the selective etching of plural cavities within the semiconductor substrate.
Figure 6B:
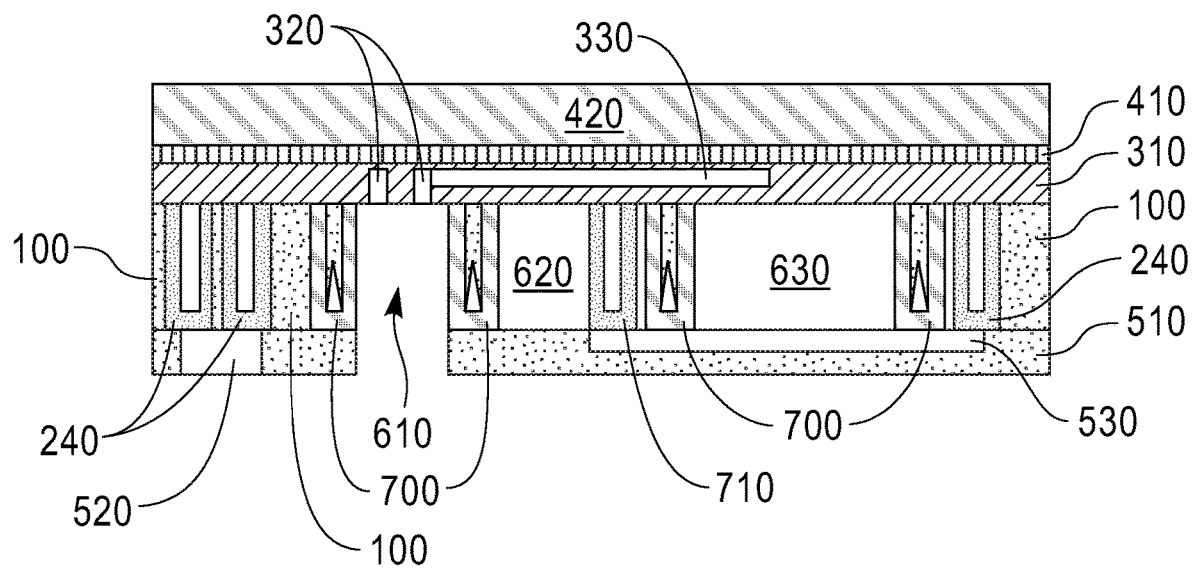
FIG. 6B shows a chip cavity, stripline cavity, and antenna cavity formed within the semiconductor substrate and supported by oxide pillars.

A selective etch such as a wet etch or a plasma-based or xenon difluoride etch is then used to remove silicon from between the spacers forming cavities 610, 620, 630, as shown in FIGS. 6A and 6B. The selective etch does not remove dielectric layers 210, 310, 510 or metallization 240, 520, 530. In the illustrated embodiment, chip cavity 610 is open at a backside of the structure, while stripline cavity 620 and antenna cavity 630 are substantially closed cavities.

Removal of silicon (or other semiconductor materials) from within a substantially closed cavity such within stripline cavity area 20 and antenna cavity area 30 may be performed by way of an etch port 312 through which a suitable etching chemistry can be introduced and etch products exhausted. In various embodiments, one or more etch ports 312 may be located on one or both of the front side and the backside of the substrate 100. In embodiments, after etching of the semiconductor material, the etch port(s) 312 can be closed such as by localized deposition of a dielectric to form a closed cavity.

Various wet etch chemistries may be used to etch silicon, for example. Single crystal and polycrystalline silicon may be etched using a mixture of hydrofluoric acid (HF) and nitric acid ($HNO_3$), These etchants generally provide isotropic etching. Without wishing to be bound by theory, the etching is initiated by $HNO_3$, which forms an oxide layer on the silicon, while the HF then dissolves the oxide. Water may be used as a diluent, and acetic acid may be used as a buffering agent.

In lieu of a wet etch chemistry, gaseous etchants such as xenon difluoride ($XeF_2$) may be used to etch silicon. With a gas-based etchant, the etch ports can be small (e.g., less than 0.1 microns in diameter), which allows the etch ports to be easily closed, for example, in vacuum using CVD silicon oxide.

Chip cavity 610, stripline cavity 620, and antenna cavity 630 can be square, rectangular, circular or oval, and may have areal dimensions ranging from 10 microns to 10 mm. A chip cavity 610 may have a length and width of 1 mm and 1.5 mm, for example. An antenna cavity 620 may have a length and a width each equal to 2 mm.

Selective etching of the silicon (or other like semiconductor material) reveals spacers 700 comprising dielectric 210 and structures 710 comprising metallization 240 that extend from a top surface to a bottom surface of respective cavities. In embodiments, top and/or bottom cavity surfaces may comprise un-etched portions of the semiconductor substrate, dielectric 310, dielectric 510, metallization 520 and/or metallization 530. In embodiments, spacers 700 define sidewalls of the cavity. In embodiments, spacers 700 are set away from the sidewalls.

As illustrated in FIG. 6A, plural spacers 700 may be arranged parallel to each other. A distance between adjacent spacers may range from 10 microns to 500 microns, e.g., 10, 20, 50, 100, 200 or 500 microns, including ranges between any of the foregoing values.

In embodiments, RF chips (not shown) are bonded into the chip cavities and optionally embedded in underfill. A solder ball may be placed over each backside contact pad 520. The substrate may then be diced into individual die. Different die may contain different components.

Millimeter wave RF antennas and resonators may be integrated into silicon processing by introducing cavities into a silicon substrate. The cavities compensate for the relatively high dielectric constant of silicon and enable effective antenna coupling to free space, and are advantageously formed without using a second (cavity-closing) substrate, thus obviating alignment challenges that are incumbent to such a second substrate approach.

As used herein, the singular forms "a" "an" and "the" include plural referents unless the context clearly dictates otherwise. Thus, for example, reference to a "cavity" includes examples having two or more such "cavities" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a pillar that comprises silicon oxide include embodiments where a pillar consists essentially of silicon oxide and embodiments where a pillar consists of silicon oxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

The invention claimed is:

1. An electronic package apparatus comprising:
a semiconductor substrate comprising a cavity extending entirely through the semiconductor substrate, wherein the cavity comprises a horizontal topmost plane, a horizontal bottommost plane, and is bound by vertical sidewall surfaces of two vertical spacers extending only from the horizontal bottommost plane of the cavity to the horizontal topmost plane of the cavity, wherein the horizontal bottommost plane of the cavity is open and the two vertical spacers comprise a dielectric material;
a dielectric layer directly on an entire topmost horizontal surface of the semiconductor substrate, wherein the dielectric layer spans across the entire horizontal topmost plane of the cavity and an entire horizontal topmost surface of each of the two vertical spacers; and
at least one metal via contact located in the dielectric layer, wherein the at least one metal via contact has a bottommost surface that is coplanar with the horizontal topmost plane of the cavity and the at least one metal via contact is positioned over the cavity.

2. The electronic package apparatus of claim 1, wherein at least one of the two vertical spacers has a lateral dimension of less than 0.1 mm.

3. The electronic package apparatus of claim 1, wherein the semiconductor substrate comprises silicon.

4. The electronic package apparatus of claim 1, wherein at least one of the two vertical spacers is a U-shaped spacer.

5. The electronic package apparatus of claim 4, wherein the at least one U-shaped spacer comprises a void between vertical sidewalls of the U-shaped spacer.

6. The electronic package apparatus of claim 1, wherein the two vertical spacers are parallel spacers.

7. The electronic package apparatus of claim 6, wherein each of the two parallel spacers is U-shaped.

8. The electronic package apparatus of claim 7, further comprising a void between vertical sidewalls of at least one of the two parallel, U-shaped spacers.

9. The electronic package apparatus of claim 1, wherein the cavity comprises a void.

10. The electronic package apparatus of claim 1, wherein the topmost horizontal surface of the semiconductor substrate is coplanar with the topmost horizontal surface of at least one of the two vertical spacers.

11. The electronic package apparatus of claim 1, wherein the horizontal topmost plane of the cavity is coplanar with the topmost horizontal surface of at least one of the two vertical spacers.

12. The electronic package apparatus of claim 11, wherein the horizontal bottommost plane of the cavity is coplanar with a bottommost horizontal surface of at least one of the two vertical spacers.

13. The electronic package apparatus of claim 1, wherein the horizontal bottommost plane of the cavity is bound by a dielectric material.

14. The electronic package apparatus of claim 1, further comprising a transparent layer directly on a topmost horizontal surface of the dielectric layer.

15. The electronic package apparatus of claim 1, further comprising a metal strip structure embedded in the dielectric layer.

16. The electronic package apparatus of claim 1, further comprising another dielectric layer directly on a bottommost horizontal surface of the semiconductor substrate.

17. An electronic package apparatus comprising:
- a semiconductor substrate comprising a plurality of cavities extending entirely through the semiconductor substrate, wherein each cavity of the plurality cavities comprises a horizontal topmost plane, a horizontal bottommost plane, and is bound by vertical sidewall surfaces of two vertical spacers extending only from the horizontal bottommost plane of each cavity of the plurality cavities to the horizontal topmost plane of each cavity of the plurality cavities, wherein the two vertical spacers comprise a dielectric material;
- a first dielectric layer directly on an entire topmost horizontal surface of the semiconductor substrate, wherein the first dielectric layer spans across the entire horizontal topmost plane of each cavity of the plurality of cavities and an entire horizontal topmost surface of each of the two vertical spacers;
- a second dielectric layer along an entire bottommost horizontal surface of the semiconductor substrate;
- an antenna located within the second dielectric layer and spanning across the entire horizontal bottommost plane of a first cavity of the plurality of cavities and along a bottommost surface of both of the two vertical spacers that bound the first cavity of the plurality of cavities wherein the horizontal bottommost plane of a second cavity of the plurality of cavities is opened, and at least one metal via contact is located in the first dielectric layer, wherein the at least one metal via contact has a bottommost surface that is coplanar with the horizontal topmost plane of the second cavity and the at least one metal via contact is positioned over the second cavity.

\* \* \* \* \*